United States Patent
Jiang et al.

(10) Patent No.: US 10,943,540 B2
(45) Date of Patent: Mar. 9, 2021

(54) DISPLAY SYSTEM WITH CONTROLLABLE CONNECTION

(71) Applicant: Ignis Innovation Inc., Waterloo (CA)

(72) Inventors: Qing Jiang, Waterloo (CA); Junhu He, Waterloo (CA); Hongxin Liu, Cambridge (CA); Shuenn-Jiun Tang, Guelph (CA); Jafar Talebzadeh, Waterloo (CA)

(73) Assignee: Ignis Innovation Inc., Waterloo (CA)

( * ) Notice: Subject to any disclaimer, the term of this patent is extended or adjusted under 35 U.S.C. 154(b) by 0 days.

(21) Appl. No.: 16/381,577

(22) Filed: Apr. 11, 2019

(65) Prior Publication Data

US 2019/0318692 A1    Oct. 17, 2019

Related U.S. Application Data (60) Provisional application No. 62/656,073, filed on Apr. 11, 2018.

(51) Int. Cl.
| | |
|---|---|
| *G09G 3/3258* | (2016.01) |
| *H01L 27/32* | (2006.01) |
| *G09G 3/3233* | (2016.01) |
| *G09G 3/3225* | (2016.01) |

(52) U.S. Cl.
CPC ......... *G09G 3/3258* (2013.01); *G09G 3/3233* (2013.01); *H01L 27/326* (2013.01); *H01L 27/3276* (2013.01); *G09G 2320/0209* (2013.01); *G09G 2320/0295* (2013.01); *G09G 2320/045* (2013.01)

(58) Field of Classification Search
CPC ... G09G 3/30–3291; G09G 2320/0295; G09G 2300/0842; G09G 2310/0251; G09G 2310/0262; H01L 27/326; H01L 27/3276
See application file for complete search history.

(56) References Cited

U.S. PATENT DOCUMENTS

| | | | |
|---|---|---|---|
| 2003/0062844 A1* | 4/2003 | Miyazawa | G09G 3/3241 315/169.3 |
| 2006/0261864 A1* | 11/2006 | Miyazawa | G09G 3/325 327/112 |
| 2008/0042947 A1* | 2/2008 | Miyagawa | G09G 3/3233 345/82 |
| 2008/0218062 A1* | 9/2008 | Kim | H01L 51/524 313/504 |
| 2009/0256783 A1* | 10/2009 | Mizukoshi | G09G 3/3233 345/76 |
| 2011/0227889 A1* | 9/2011 | Choi | G09G 3/3233 345/209 |
| 2016/0267844 A1* | 9/2016 | Senda | G09G 3/3291 |

* cited by examiner

*Primary Examiner* — David Tung
(74) *Attorney, Agent, or Firm* — Stratford Managers Corporation (57) ABSTRACT

Display systems including novel Active Matrix Organic Light Emitting Diode (AMOLED) displays with controllable pixel-driver connections and the measuring of pixel voltage or current while controlling the controllable pixel-driver connections are disclosed. A single driver node is connected to a first node of a pixel, while a second connection from the single driver node to a second node of the pixel is disconnected using at least one peripheral controllable switch.

17 Claims, 12 Drawing Sheets

DISPLAY SYSTEM WITH CONTROLLABLE CONNECTION

CROSS-REFERENCE TO RELATED APPLICATION

This application claims the benefit of US. Provisional Application No. 62/656,073, filed Apr. 11, 2018, which is hereby incorporated by reference herein in its entirety.

FIELD OF THE PRESENT DISCLOSURE

The present disclosure relates to display systems and particularly to active matrix organic light emitting diode (AMOLED) displays with connections between drivers and pixel circuits thereof and measurement of said pixels using said connections.

BRIEF SUMMARY

According to a first aspect there is provided a display system comprising: a plurality of pixels arranged in rows and columns; at least one driver for driving the plurality of pixels; a controller coupled to the at least one driver for controlling the at least one driver's driving of the plurality of pixels; a first signal line coupling a first node of a first pixel of the plurality of pixels to a node of the at least one driver; and a second signal line coupling a second node of the first pixel to the node of the at least one driver via a controllable switch coupled along the second signal line and located outside of the plurality of pixels, the controllable switch for coupling the second signal line to the node of the at least one driver and for decoupling the second signal line from the node of the at least one driver.

In some embodiments, the node of the at least one driver comprises a supply voltage output of the at least one driver for providing a supply voltage to the first pixel.

In some embodiments, one of the first signal line and the second signal line comprises a row signal line, and the other of the first signal line and the second signal line comprises a column signal line.

In some embodiments, the node of the at least one driver comprises a conductive ring surrounding the plurality of pixels, in which the first signal line is coupled to the conductive ring, and in which the second signal line is coupled to the conductive ring via the controllable switch.

In some embodiments, the second signal line extends adjacent to and beyond the first pixel, in which the second signal line is coupled to multiple pixels of the plurality of pixels, and in which an end of the second signal line opposite from the controllable switch is uncoupled.

In some embodiments, the controller is adapted to control the at least one driver to send switch control signals over a switch control line coupled to the controllable switch.

In some embodiments, the plurality of pixels comprise OLED pixels.

In some embodiments, the first signal line spans the conductive ring and the second signal line is coupled at one end to the controllable switch and coupled at an opposite end to a second controllable switch coupled to the conductive ring.

In some embodiments, the first signal line and the second signal line extend adjacent to and beyond the first pixel, in which each of the first signal line and the second signal line are coupled to multiple pixels of the plurality of pixels.

In some embodiments, the controller is adapted to control the at least one driver to send switch control signals over at least one switch control line coupled to the controllable switch and the second controllable switch.

In some embodiments, the first signal line is one of a first plurality of signal lines spanning the conductive ring in a first direction and the second signal lime is one of a second plurality of signal lines spanning the conductive ring in a second direction, the first plurality of signal lines, the second plurality of signal lines, and the conductive ring forming a disconnected grid structure.

Some embodiments further provide for a readout circuit for reading a voltage or current from the first pixel over a data line coupled to the first pixel.

In some embodiments, the controller is adapted to control the controllable switch and the second controllable switch to turn on and connect the second node of the first pixel to the supply voltage during an emission cycle, and in which the controller is adapted to control the controllable switch and the second controllable switch to turn off and disconnect the second node of the first pixel from the supply voltage while reading a voltage or current from the first pixel over the data line.

The foregoing and additional aspects and embodiments of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the disclosure will become apparent upon reading the following detailed description and upon reference to the drawings.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

An OLED device is a Light Emitting Diode (LED) in which the emissive electroluminescent layer is a film of organic compound that emits light in response to an electric current. This layer of organic material is situated between two electrodes; typically, at least one of these electrodes is transparent. Compared to conventional Liquid Crystal Displays (LCDs), Active Matrix Organic Light Emitting Device (AMOLED) displays offer lower power consumption, manufacturing flexibility, faster response time, larger viewing angles, higher contrast, lighter weight, and amenability to flexible substrates. An AMOLED display works without a backlight because the organic material of the OLED within each pixel itself emits visible light and each pixel consists of different colored OLEDs emitting light independently. The OLED panel can display deep black level and can be thinner than an LCD display. The OLEDs emit light according to currents passing through them supplied through drive transistors controlled by programming voltages. The power consumed in each pixel has a relation with the magnitude of the generated light in that pixel.

The quality of output in an OLED-based pixel depends on the properties of the drive transistor, which is typically fabricated from materials including but not limited to amorphous silicon, polysilicon, or metal oxide, as well as properties of the OLED itself. In particular, the critical drawbacks of OLED displays include luminance non-uniformity due to the electrical characteristic variations of the drive transistor such as threshold voltage and mobility as the pixel ages and image sticking due to the differential aging of OLED devices. In order to maintain high image quality, variation of these parameters is compensated for by adjusting the programming voltage. In order to do so, those parameters are extracted from the driver circuit. The measured information can then be used to inform subsequent programming of the pixel circuits so that adjustments may be made to the programming taking into account the measured degradation.

Aspects of the present disclosure include a novel display system in which a driver input/output is connected via multiple lines to a single pixel, one line of which is controllable to enable connection to and disconnection from the pixel. The multiple lines are configurable in a number of ways, and in a specific example application, measurement of the OLED and pixel current through a data line in order to extract parameters of the pixel and OLED to be used for compensation is performed. In some embodiments a modified VDD grid pattern facilitates the current measurement. In some embodiments pixel circuits are disconnected from a VDD ring during the current measurement.

Figure 1:
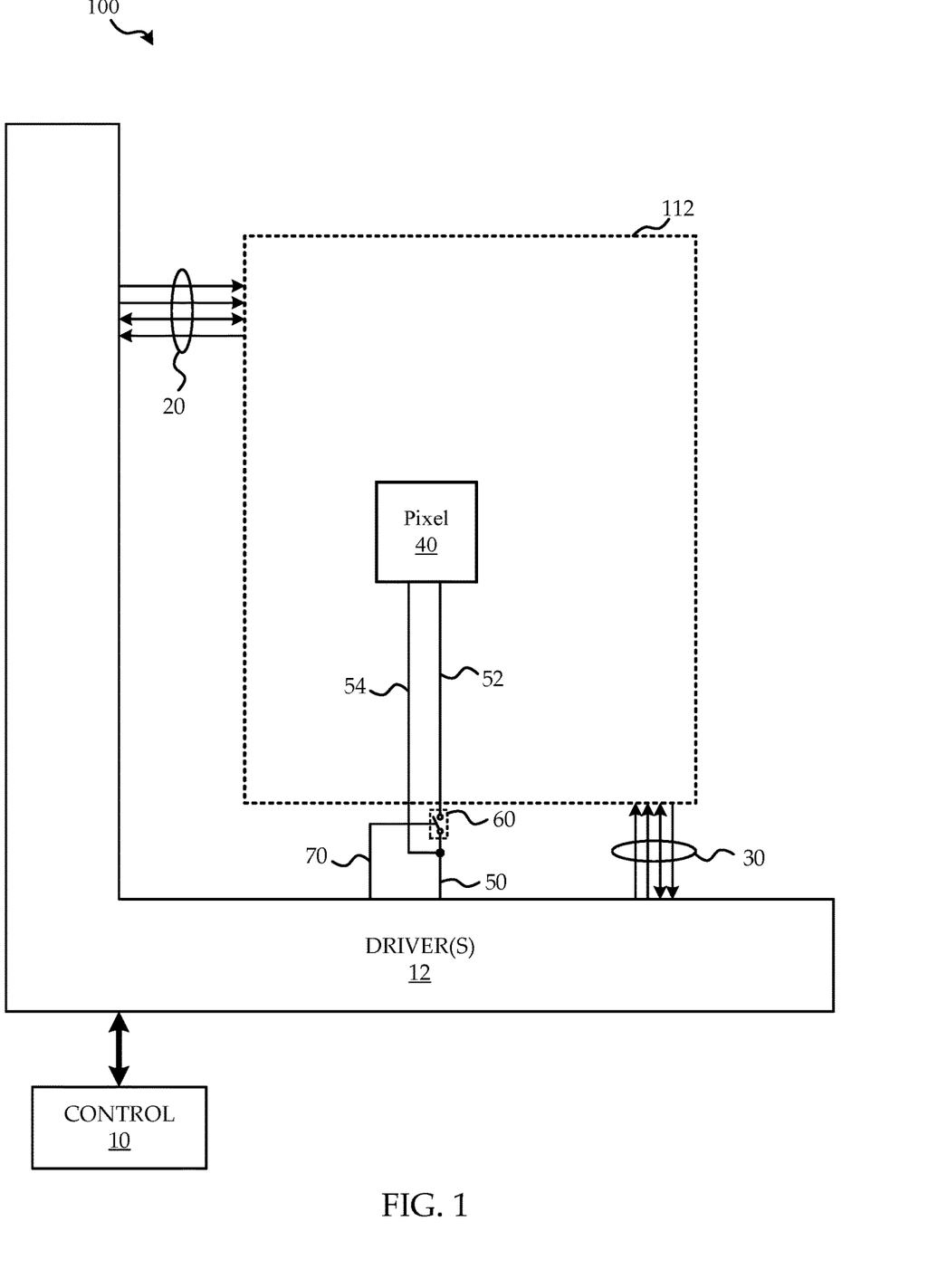
FIG. 1 is a schematic block diagram of a display system in accordance with an embodiment.

FIG. 1 shows a block diagram of an exemplary display system 100 having an exemplary driver-pixel connection according to an embodiment. The display system 100 includes a display panel 112, one or more drivers 12 which may include a number of drivers in a peripheral area of the display 100. The drivers typically include a gate or address driver, a data driver, source driver, and/or reference driver or a source driver that includes functionality to provide supply, data, and reference voltages, such as the source driver 108 of FIG. 2. In some embodiments the drivers include readout circuitry such as the readout circuit (ROC) 110 of FIG. 2. It is to be understood that the one or more drivers 12 are located peripherally to the display panel 112 but may be located in any combination of above, below, and on either side of the display panel 112. A control unit 10 is coupled to the one or more drivers 12 for controlling the operation of the display panel 112, and may include a controller 104 and a memory 106 such as those of FIG. 2. The display panel 112 includes a plurality of pixels 40 often arranged in rows and columns. Each pixel 40 has a circuit typically including Thin Film Transistors (TFTs), a storage capacitor and a light-emitting device (such as the pixel of FIG. 3). Each pixel 40 is individually programmed to emit light with a specific luminance value. The control unit 10 receives digital video data indicative of information to be displayed on the display panel 112 and sends signals comprising digital video data to the display panel via the one or more drivers 12 while also sending signals to the one or more drivers 12 to control the pixels 40 within the display panel 112. Horizontal signal lines 20 and vertical signal lines 30 couple the one or more drivers 12 to the pixels 40. Supply voltages and/or reference voltages, as well as monitor lines or lines otherwise used for bidirectional signaling or receiving signals from the pixels may be included in the horizontal signal lines 20 and vertical signal lines 30. In some embodiments the programming data are sent via vertical signal lines 30 while control signals (select and other control signaling) are provided from the one or more drivers 12 over the horizontal signal lines 20 to drive the pixels 40 in the display panel 112 on a row by row basis to display the information indicated in the video data. The plurality of pixels 40 associated with the display panel 112 thus comprise a display array ("display screen") adapted to dynamically display information according to the input digital data received by the control unit 10. The display panel 112 can display, for example, video information from a stream of video data received by the control unit 10.

In FIG. 1, the display panel 112 is illustrated as only including one pixel 40 for simplicity and illustrative purposes. The display system 100 is implemented with a plurality of similar pixels, such as the pixel 40 and the display panel size is not restricted to a particular number of rows and columns of pixels. For example, the display system 100 can be implemented with a display panel with a number of rows and columns of pixels commonly available in displays for mobile devices, monitor-based devices, TVs and projection devices.

The display panel 112 includes at least one pixel 40 which is coupled to a single node 50 (output or input) of the one or more drivers 12, via at least two signal lines 54 52. The at least two signal lines 54 52 should be understood as being among the horizontal signal lines 20 and/or vertical lines 30, and are here shown separately (and only vertically) for illustrative purposes only. The pixel 40 has two nodes (not shown) which are connectable via the two signal lines 54 52 to the single node 50 of the one or more drivers 12. At least one of the signal lines 54 52 is connected to the single node 50 of the one or more drivers 12 via a switch 60 which is controlled to couple or decouple the signal line 52 to the single node 50 of the one or more drivers 12 with use of a switch control line 70. The control unit 10 communicates with the one or more drivers 12 to control the switch control line 70 to open and close the switch 60 according to the appropriate timings for the application and the particular structure and function of the pixel 40. It should be understood that the output of the one or more drivers 12 for switch control signals over the switch control line 70 need not be located proximate the single node 50, and in general can be located in any portion of the one or more drivers 12 depending upon the context. For example, in an embodiment such as that depicted in FIG. 2, access to the single VDD node of the source driver 108 by multiple columns of pixels may be simultaneously controlled by EN-VDD signals over horizontal signal lines from the gate driver 102. It also should be understood that the location of the single node 50 and switch 60 may be along a side of the display panel 112 or above the display panel 112 or below it as shown.

In the broad embodiment depicted in FIG. 1, the signal lines 54 52 may be used for output from or input to the pixel, and may serve to convey control, data, supply, reference or any other kinds of voltages or currents to and/or from the single node 50. In some pixel designs multiple connections to a single node 50 of the one or more drivers 12, of which at least one is capable of being decoupled, is desired. In order to increase pixel area for light emission, and reduce pixel circuitry, the embodiment of FIG. 1 utilizes the switch 60 which is outside of the area of the pixels 40 of the display panel 112 to effect the coupling and decoupling.

Figure 2:
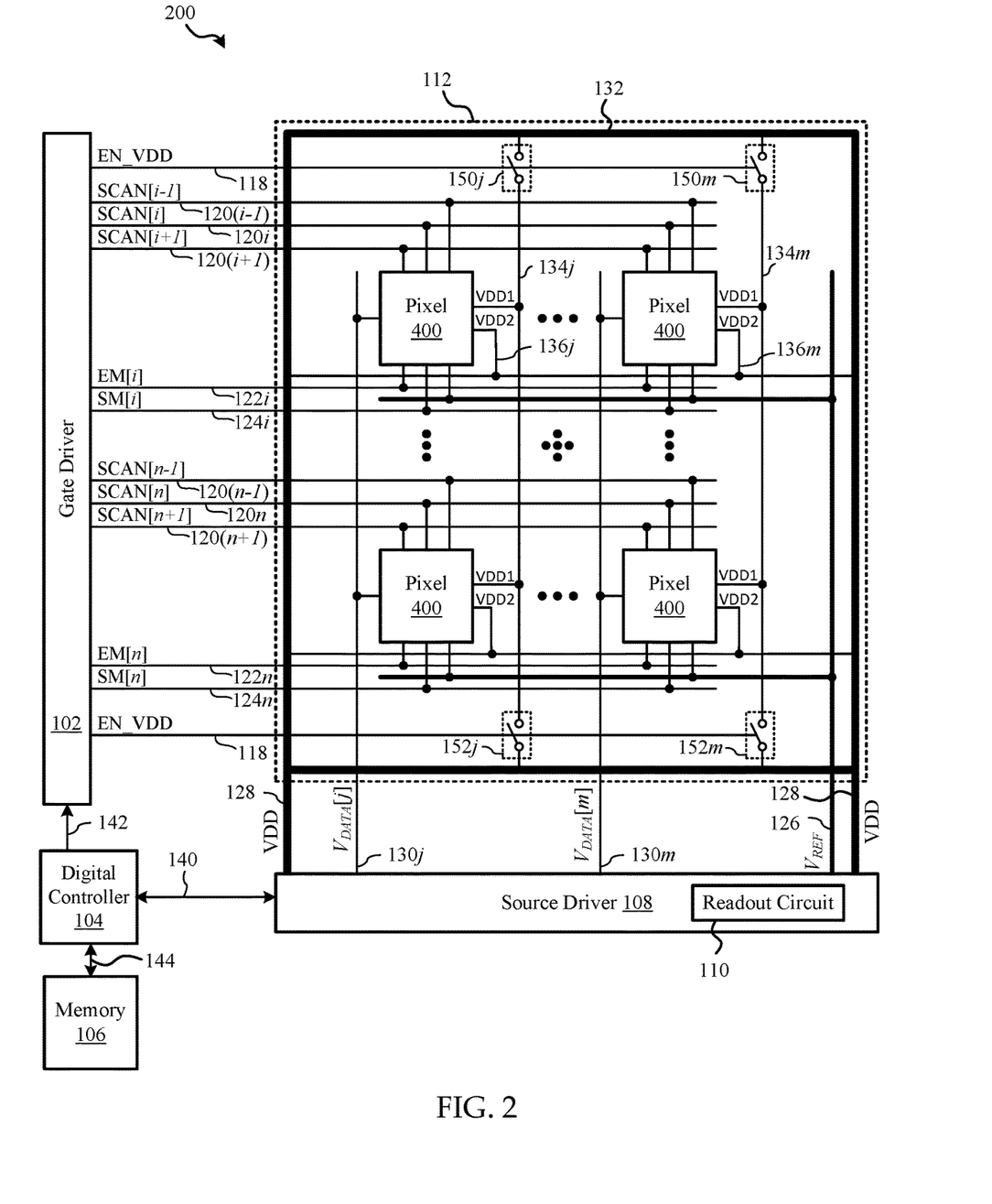
FIG. 2 is a detailed schematic block diagram of a display system in accordance with an example embodiment.
Figure 3:
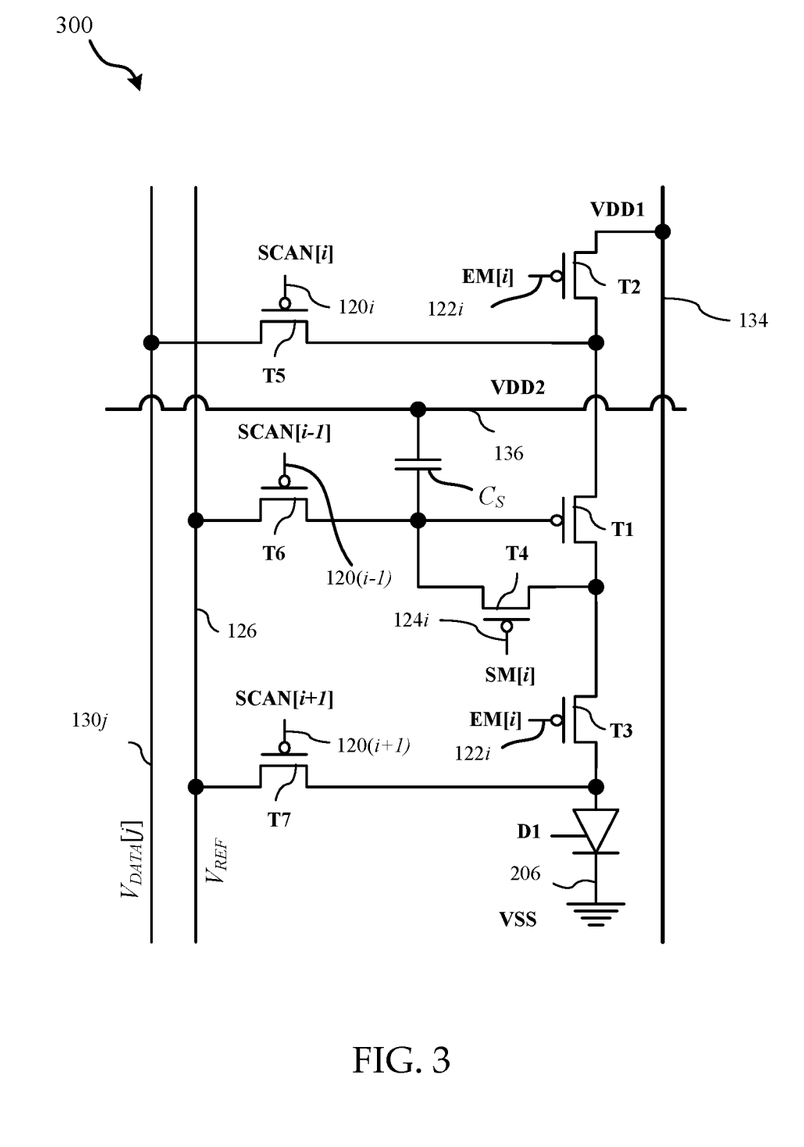
FIG. 3 is a schematic circuit diagram of an example embodiment of a pixel circuit, the pixel circuit including seven TFT transistors, an OLED, and a capacitor.

FIG. 2 shows a detailed block diagram of an exemplary OLED display system 200 in which an exemplary driver-pixel connection as illustrated in FIG. 1 is implemented. The display system 200 includes a display panel 112, a source driver 108 (which includes a Readout Circuit (ROC) 110), a gate driver 102, a digital controller block 104 and a memory storage 106. The display panel 112 includes a plurality of pixels 400 arranged in rows and columns. Each pixel 400 has a circuit including seven Thin Film Transistors (TFTs), a storage capacitor and an OLED (for example as shown in FIG. 3). Each pixel 400 is individually programmed to emit light with specific luminance value. The digital controller 104 receives digital video data indicative of information to be displayed on the display panel 112. The controller 104 sends signals 140 comprising digital video data to the source driver 110 and signals 142 to the gate driver 102 to drive the pixels 400 in the display panel 112 on row by row basis to display the information indicated. Each pixel 400 is coupled to a number of vertical signal lines carrying data (programming current or voltage $V_{DATA}$) and supply voltages (VDD) to a number of pixels in each column, and each pixel 400 is also coupled to a number of horizontal signal lines carrying control signaling (SCAN, EM, SM signals) as well as reference and supply voltages ($V_{REF}$, VDD) to a number of pixels in each row. The plurality of pixels 400 associated with the display panel 112 thus comprise a display array ("display screen") adapted to dynamically display information according to the input digital data received by the controller 104. The display panel 112 can display, for example, video information from a stream of video data received by the controller 104.

In FIG. 2, the display panel 112 is illustrated as including only four pixels 400 for simplicity and illustrative purposes. The display system 100 is implemented with a plurality of similar pixels, such as the pixel 400 and the display panel size is not restricted to a particular number of rows and columns of pixels. For example, the display system 100 can be implemented with a display panel with a number of rows and columns of pixels commonly available in displays for mobile devices, monitor-based devices, TVs and projection devices.

As shown in FIG. 2, the pixel illustrated as the top-left pixel in the display panel 112 represents a "ith" row and "jth" column, is coupled to scan signals SCAN[i−1] 120(i−1), SCAN[i] 120i, SCAN[i+1] 120(i+1), an emission signal line EM[i] 122i, an SM[i] signal 124i, a supply line VDD1 134j, a supply line VDD2 136j, a data line $V_{DATA}$[j] 130j, and a reference line $V_{REF}$ 126.

As shown in FIG. 2, the pixel illustrated as the top-right pixel in the display panel 112 represents a "ith" row and "mth" column, is coupled to scan signals SCAN[i−1] 120(i−1), SCAN[i] 120i, SCAN[i+1] 120(i+1), an emission signal line EM[i] 122i, an SM[i] signal 124i, a supply line VDD1 134m, a supply line VDD2 136m, a data line $V_{DATA}$[m] 130m, and a reference line $V_{REF}$ 126.

As shown in FIG. 2, the pixel illustrated as the bottom-left pixel in the display panel 112 represents a "nth" row and "jth" column, is coupled to scan signals SCAN[n−1] 120(n−1), SCAN[n] 120n, SCAN[n+1] 120(n+1), an emission signal line EM[n] 122n, an SM[n] signal 124n, a supply line VDD1 134j, a supply line VDD2 136j, a data line $V_{DATA}$[j] 130j, and a reference line $V_{REF}$ 126.

As shown in FIG. 2, the pixel illustrated as the bottom-right pixel in the display panel 112 represents a "nth" row and "mth" column, is coupled to scan signals SCAN[n−1] 120(n−1), SCAN[n] 120n, SCAN[n+1] 120(n+1), an emission signal line EM[n] 122n, an SM[n] signal 124n, a supply line VDD1 134m, a supply line VDD2 136m, a data line $V_{DATA}$[m] 130m, and a reference line $V_{REF}$ 126.

As illustrated in FIG. 1, the example embodiment of FIG. 2 includes a single node VDD which is coupleable to each pixel at multiple nodes, VDD1, and VDD2, over respective signal lines 134 and 136. Signal line 134 may be completely decoupled from VDD via switches 152 and 150 which are controlled by EN_VDD. The display panel 112 also includes a VDD ring 132 which all pixels 400 are connected to through switches 150 and 152. Each pixel 400 has two VDD nodes: VDD1 134 and VDD2 136. The VDD2 node 136 is always connected to VDD ring 132, however the VDD1 node 134 is connected to the VDD ring 132 through switches 150 and 152 when EN_VDD 118 is set to zero, i.e. EN_VDD=0, and the VDD1 node 134 is disconnected from the VDD ring 132 when EN_VDD 118 is set to VDD, i.e. EN_VDD=VDD. Further details of the example embodiment of FIG. 2 and its operation in an example current measurement will be described further below.

In some embodiments, the data line (130j, 130m) connects the pixels 400 to the readout circuit 110. The data line (130j, 130m) allows the readout circuit 110 to measure a current associated with each pixel 400 and thereby extract information indicative of a degradation of the pixel 400. The Readout circuit 110 converts the associated current into a corresponding voltage. In some embodiments, this voltage is converted into a 10 to 16 bit digital code and is sent to digital control for further processing or compensation for the pixel luminance.

Figure 10:
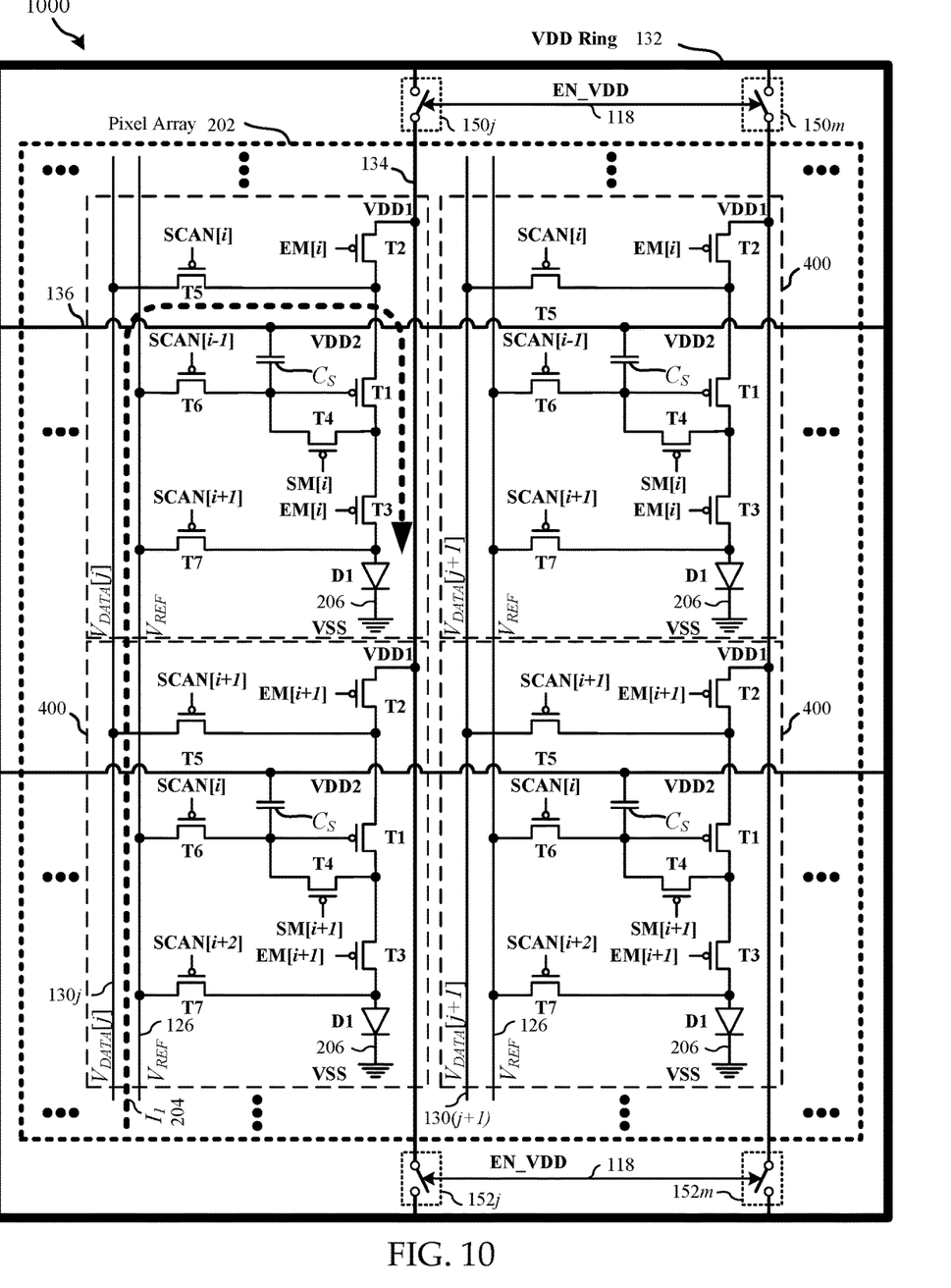
FIG. 10 is a schematic circuit diagram of a portion of the display system of FIG. 2 utilizing the pixel circuit of FIG. 3 in an implementation of the example embodiment of FIG. 9 performing a current measurement.
Figure 12:
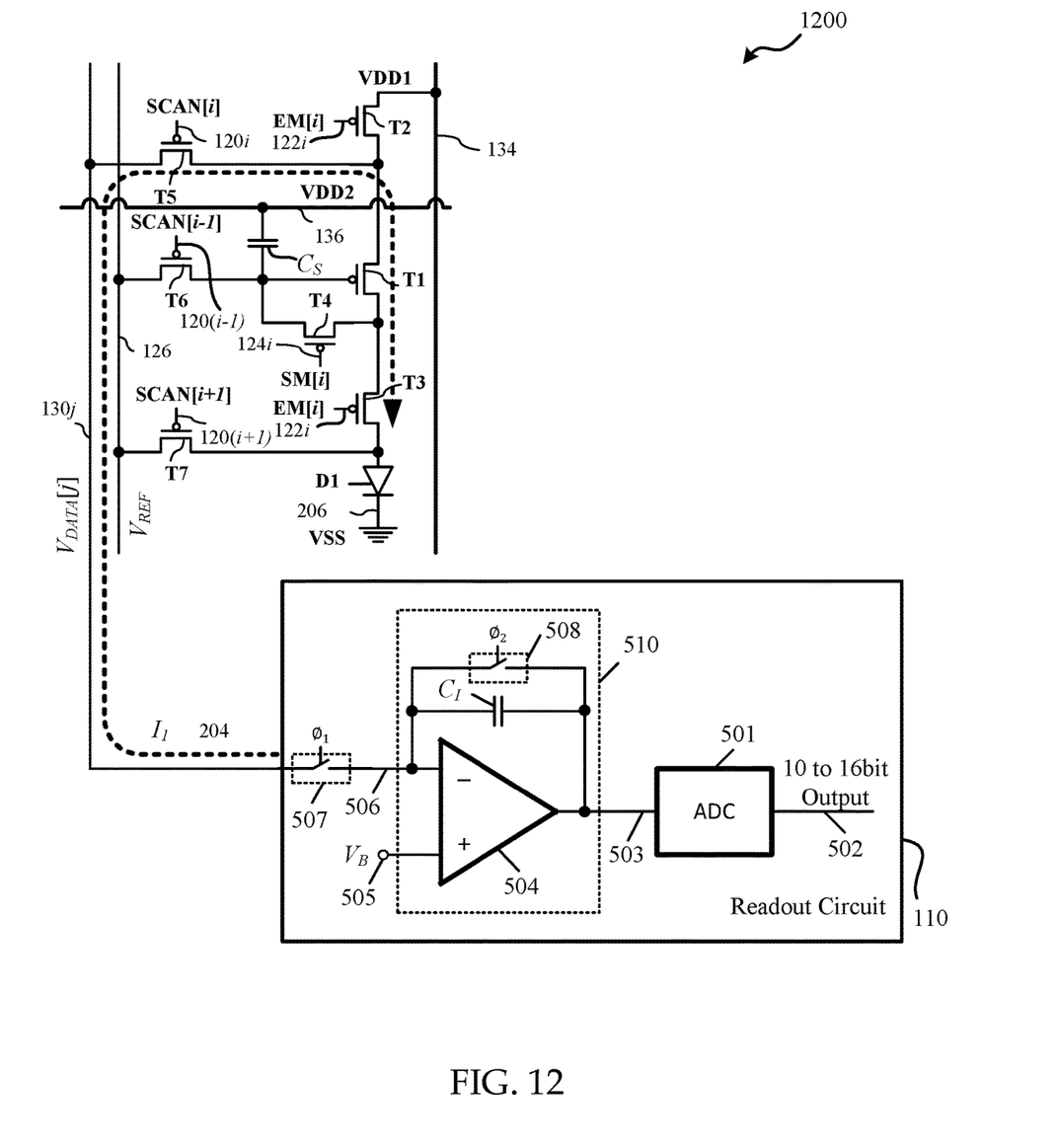
FIG. 12 is a schematic block diagram illustrating current measurement, in the display system of FIG. 2, of the pixel of FIG. 3 implemented in the example embodiment of FIG. 10.

FIG. 3 a schematic circuit diagram of an example embodiment of a pixel circuit 300 which may be implemented in any of the display system embodiments described herein, and specifically may be implemented in the example display system 200 of FIG. 2 (also illustrated in FIG. 10 and FIG. 12). In pixel circuit 300, a driving transistor T1 is controlled by voltage stored on a storage capacitor $C_S$ to provide a current to the light emitting device D1 during the emission cycle. Supply voltage VDD is coupled to this single pixel via two nodes coupled to respective lines, namely, VDD1 134 and VDD2 136. Emission transistors T2 and T3 are controlled by the same control signal EM[i] to reduce driver complexity (for the gate driver 102) and the number of separate control signal lines to the pixel 300. Since emission transistors T2 and T3 are controlled by a single control signal, they are both on or both off at any one time. This is desirable during the emission cycle when current flows from VDD1 through the OLED to VSS 206 and when the voltage at the source of the drive transistor T1 (coupled to VDD1) is held at the same voltage as the node VDD2 coupled to the storage capacitor $C_S$, but not during a current measurement (such as illustrated and discussed in association with FIGS. 10 and 12). Moreover, during current measurement it is desirable that the voltage supplied at node VDD2 136 remain at VDD. Specifically, to ensure current does not enter or leave the pixel over VDD1 line 134 during current measurements, the VDD1 line 134 is completely disconnected from VDD at the periphery of the display system in accordance with any of the embodiments of the display system described herein. Further details of the specific pixel structure and function will be discussed below in connection with an example operation of current measurement. More details regarding the pixel structure and function are not generally required to illustrate the controllable driver-pixel connections which are the subject of the embodiments. It is to be understood in general, that the embodiments described herein are applicable to any kind of pixel circuit for which it is desirable to have multiple nodes connected to a single node 50 of the one or more drivers 12 of a display system at least some of the time and for a node of the pixel to be decoupled from the single node 50 of the one or more drivers 12 at least some of the time.

The transistors illustrated in the pixel circuit 300 are p-type Thin Film Transistors (TFTs), but implementations of the present disclosure are not limited only to pixel circuits having a particular polarity of transistor or only to pixel circuits having thin-film transistors.

Figure 4:
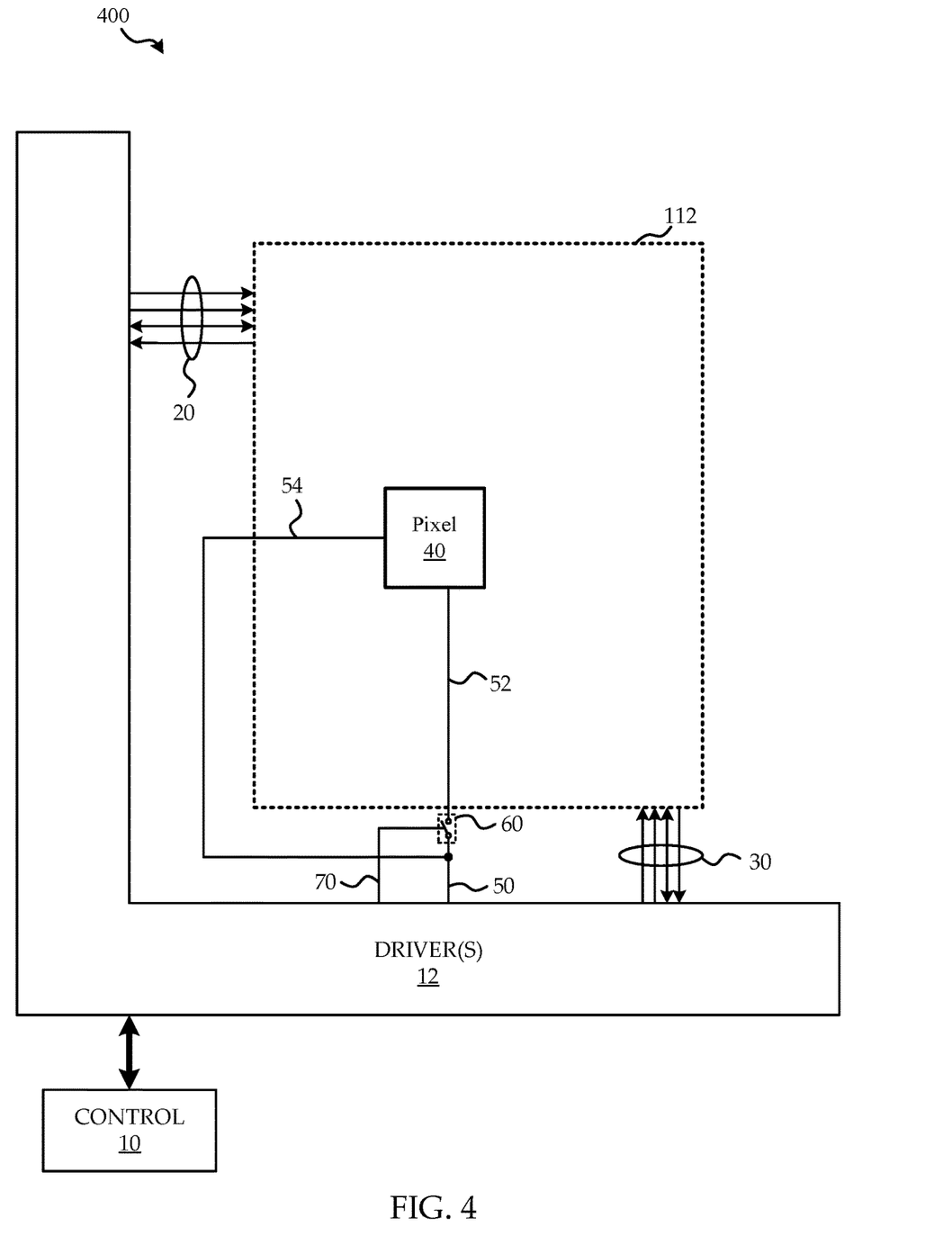
FIG. 4 is a schematic block diagram of a display system in accordance with an example embodiment utilizing horizontal and vertical signal lines.

Referring now to FIG. 4, an exemplary display system 400 having an exemplary driver-pixel connection according to another embodiment is described. The display system 400 is structured and functions similar to that of FIG. 1 except FIG. 4 explicitly illustrates one of the at least two signal lines 54 52 being horizontal while the other is vertical within the display panel 112. It is to be understood that the signal line coupled to the switch 60 may be the horizontal signal line 54 or the vertical signal line 52 as shown. It also should be understood that the location of the single node 50, the switch 60, and origin of the switch control line 70 may independently be anywhere along either side of the display panel 112 or above the display panel 112 or below it as shown.

Figure 5:
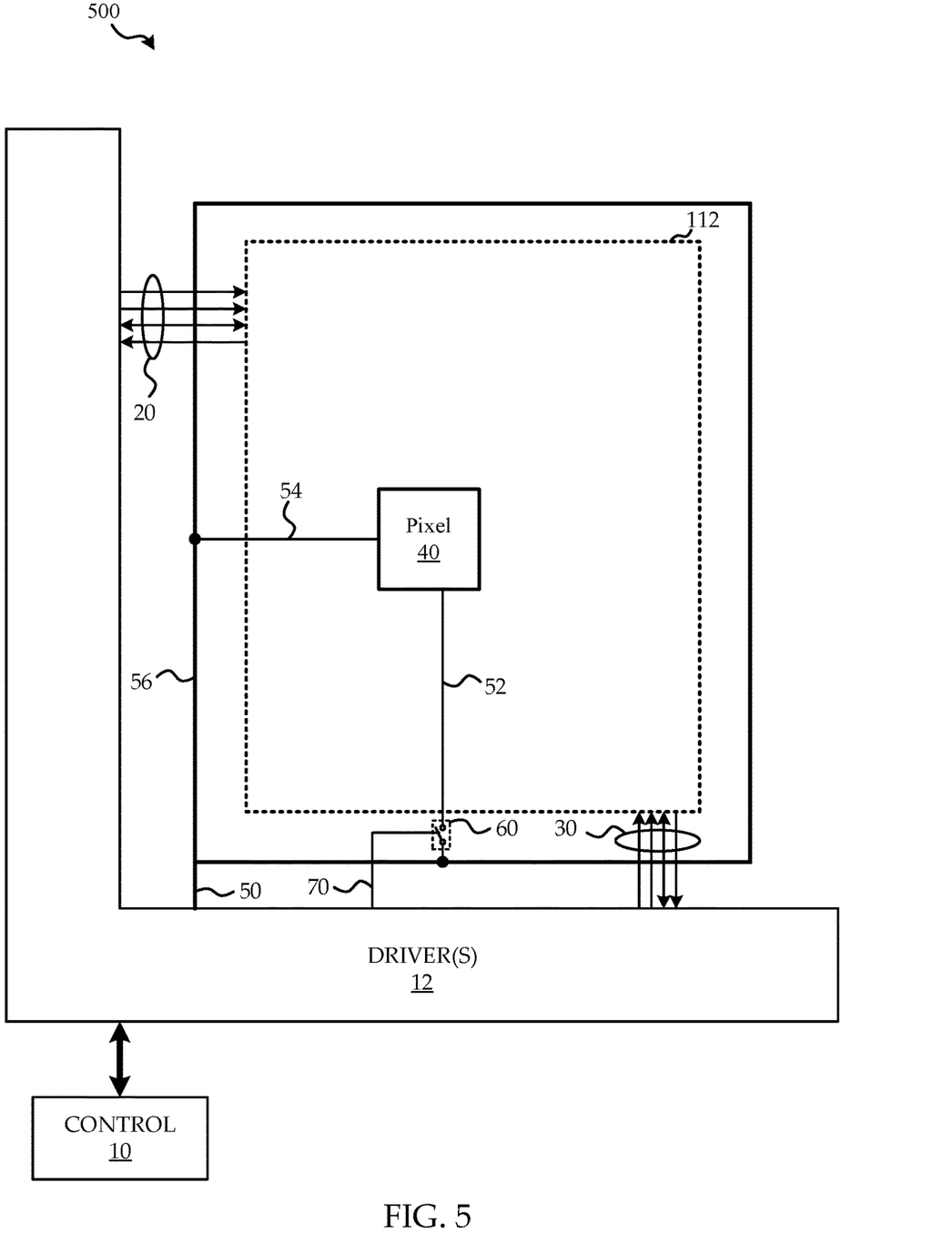
FIG. 5 is a schematic block diagram of a display system in accordance with an example embodiment utilizing horizontal and vertical signal lines and a conductive ring.

Referring now to FIG. 5, an exemplary display system 500 having an exemplary driver-pixel connection according to another embodiment is described. The display system 500 is structured and functions similar to that of FIG. 1 except FIG. 5 explicitly illustrates the single node 50 is coupled via a conductive ring 56 to both signal lines 54 52, one of which (signal line 54) being horizontal while the other is vertical within the display panel 112. As described above the single node 50 is coupled to one signal line 52 via the switch 60. It is to be understood that the signal line coupled to the switch 60 may be the horizontal signal line 54 or the vertical signal line 52 as shown. It also should be understood that the location of the single node 50, the switch 60, and the origin of the switch control line 70 may independently be anywhere along either side of the display panel 112 or above the display panel 112 or below it as shown.

Figure 6:
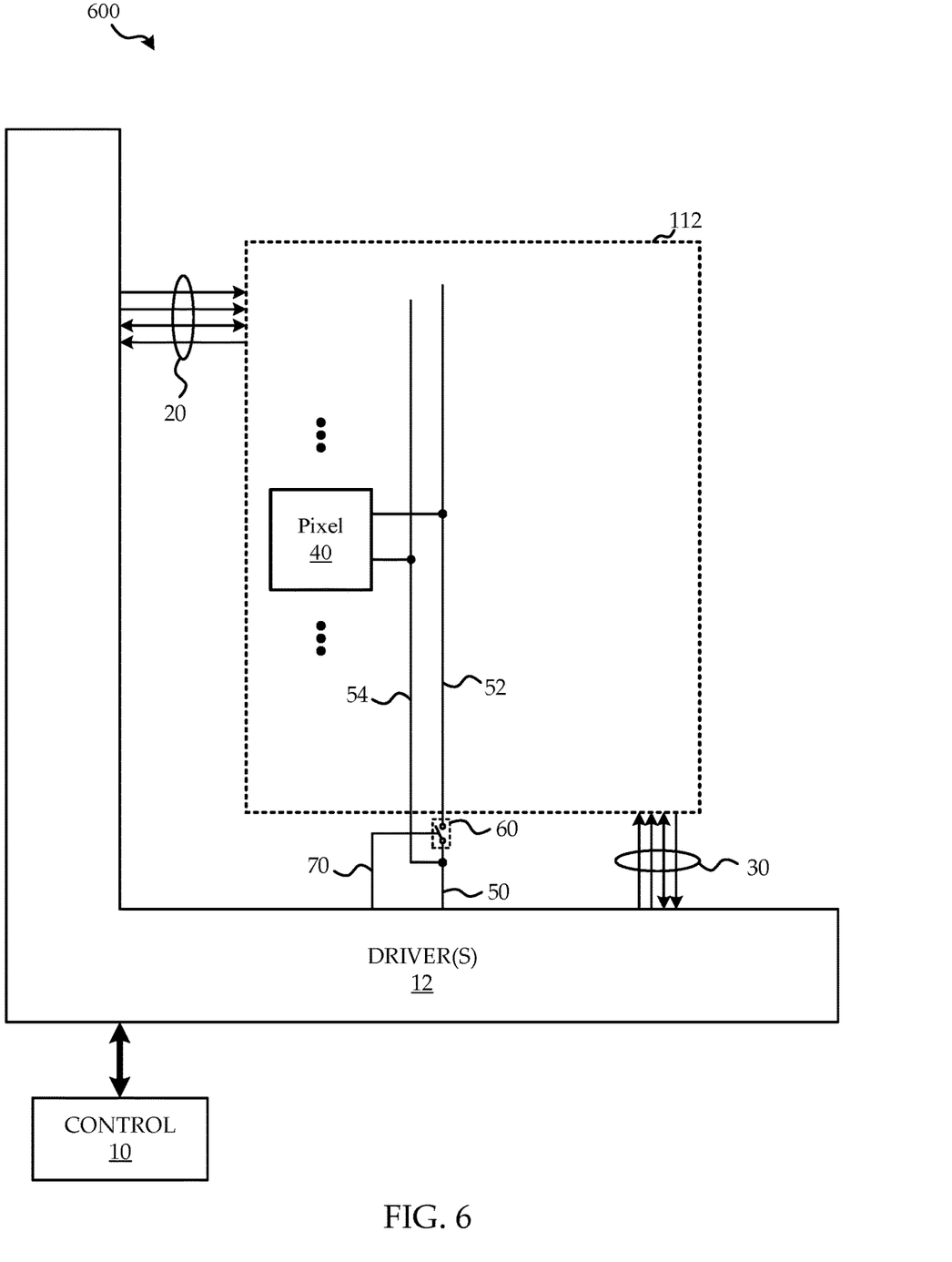
FIG. 6 is a schematic block diagram of a display system in accordance with an example embodiment utilizing signal lines common to a plurality of pixels in a column or row.

Referring now to FIG. 6, an exemplary display system 600 having an exemplary driver-pixel connection according to another embodiment is described. The display system 600 is structured and functions similar to that of FIG. 1 except FIG. 6 explicitly illustrates the at least two signal lines 54 52 situated beside the pixel 40 and extending beyond it along a column. In the display system 600 the pixel 40 and any number of other pixels in the same column are each connected by at least two nodes respectively to the two signal lines 54 52. It is to be understood that an equivalent horizontal configuration of signal lines coupled or coupleable to rows of pixels is contemplated by the embodiment. In some embodiments, the far end of the signal line 52 coupled to the switch 60 terminates without any other connection, allowing it to float when switch 60 is off. It should be understood that the location of the single node 50, the switch 60, and the origin of the switch control line 70 may independently be anywhere along either side of the display panel 112 or above the display panel 112 or below it as shown.

Figure 7:
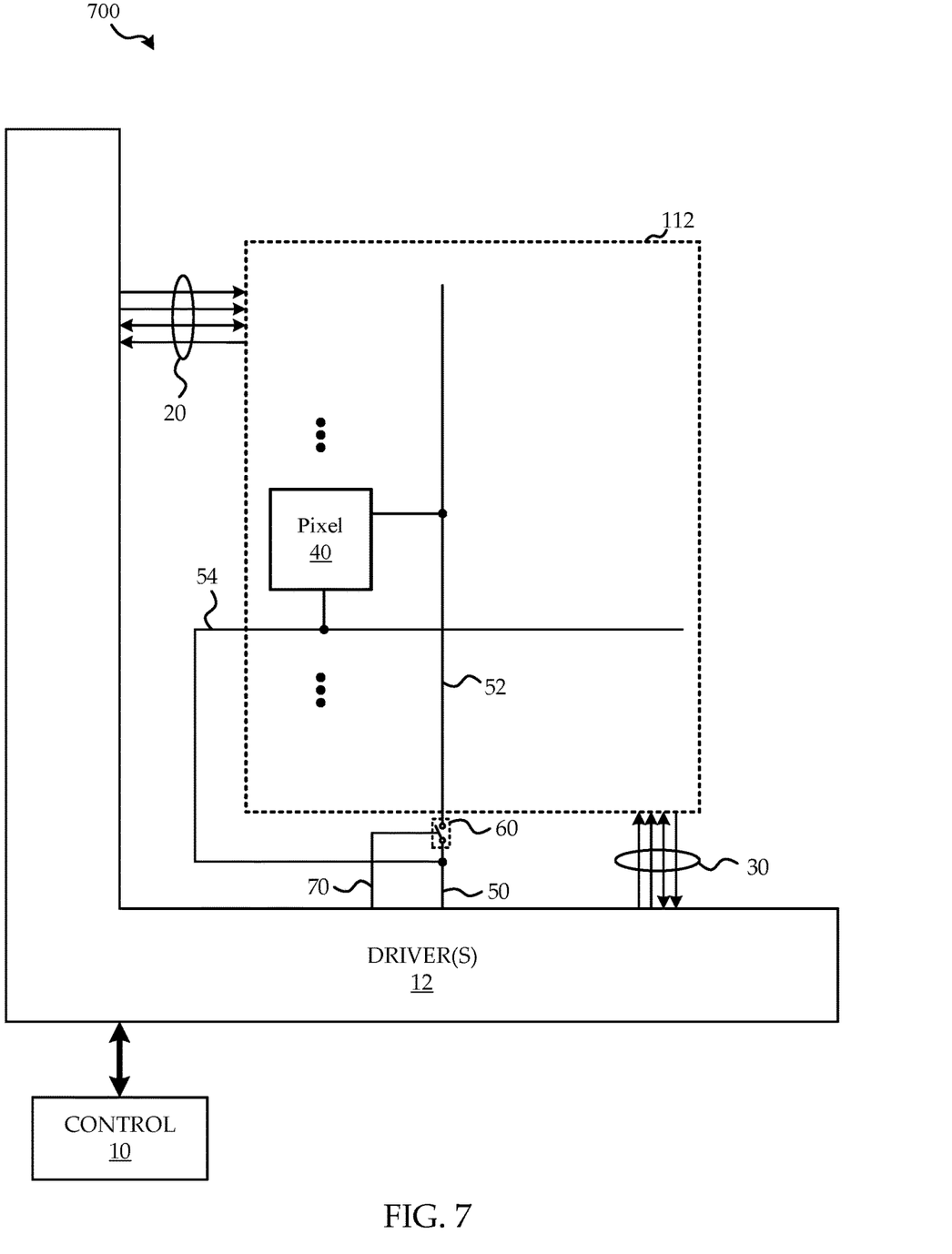
FIG. 7 is a schematic block diagram of a display system in accordance with an example embodiment utilizing horizontal and vertical signal lines common to a plurality of pixels in columns and rows.

Referring now to FIG. 7, an exemplary display system 700 having an exemplary driver-pixel connection according to another embodiment is described. The display system 700 is structured and functions similar to that of FIG. 1 except FIG. 7 explicitly illustrates one signal line 52 situated beside the pixel 40 and extending beyond it along a column and the other signal line 54 situated below the pixel 40 and extending beyond it along a row. In the display system 700 the pixel 40 and any number of other pixels in the same column are each connected by one node to one signal line 52 and any number of other pixels in the same row are each connected by a second node to the other signal line 54. It is to be understood that the signal line coupled to the switch may be the horizontal signal line 54 or the vertical signal line 52 as shown. In some embodiments, the far end of the signal line 52 coupled to the switch 60 terminates without any other connection, allowing it to float when switch 60 is off. It should be understood that the location of the single node 50, switch 60, and the origin of the switch control line 70 may independently be along either side of the display panel 112 or above the display panel 112 or below it as shown.

Figure 8:
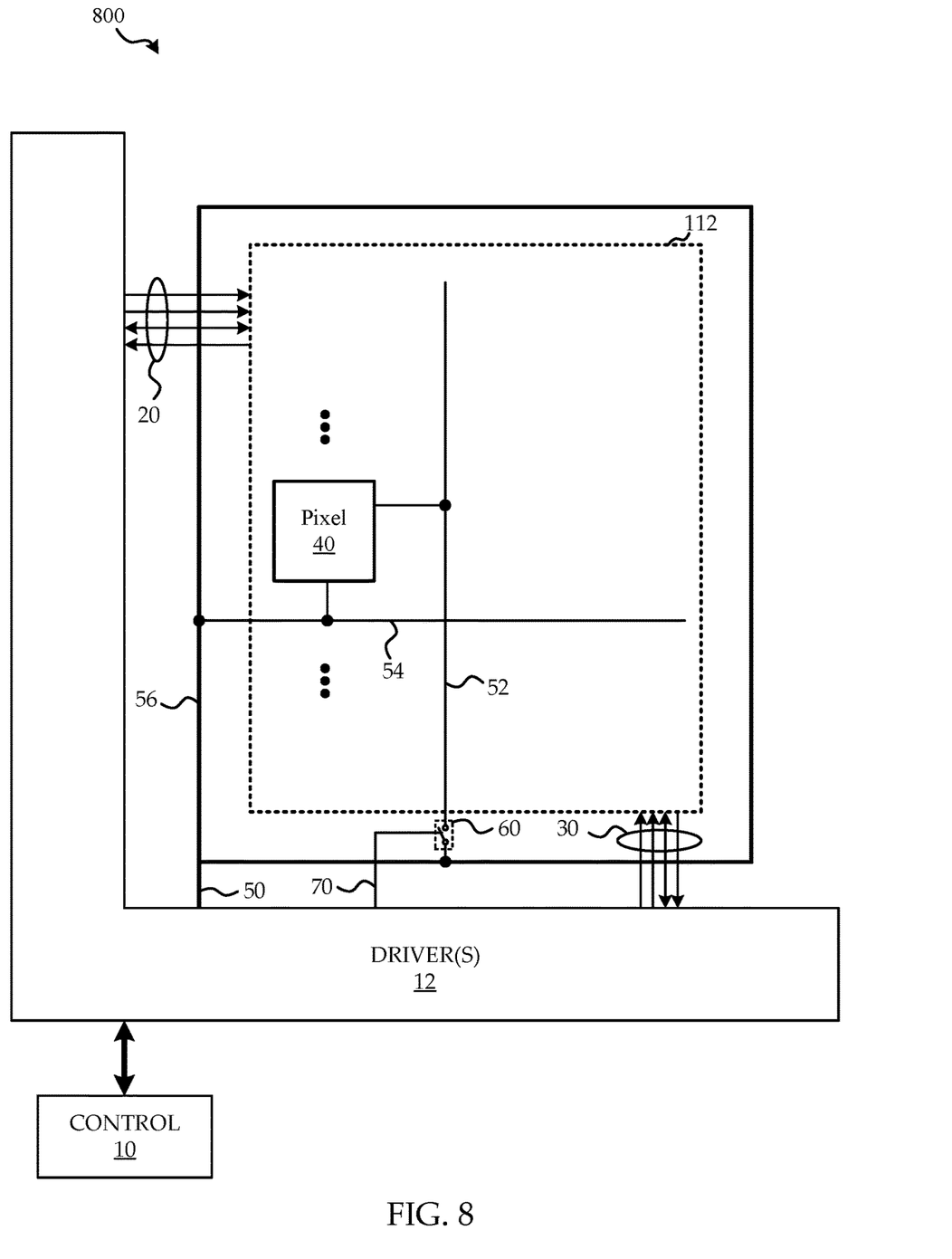
FIG. 8 is a schematic block diagram of a display system in accordance with an example embodiment utilizing horizontal and vertical signal lines common to a plurality of pixels in columns and rows and utilizing a conductive ring structure.

Referring now to FIG. 8, an exemplary display system 800 having an exemplary driver-pixel connection according to another embodiment is described. The display system 800 is structured and functions similar to that of FIG. 1 except FIG. 8 explicitly illustrates one signal line 52 situated beside the pixel 40 and extending beyond it along a column and the other signal line 54 situated below the pixel 40 and extending beyond it along a row. In the display system 800 the pixel 40 and any number of other pixels in the same column are each connected by one node to one signal line 52 and any number of other pixels in the same row are each connected by a second node to the other signal line 54. FIG. 8 explicitly illustrates the single node 50 is coupled via a conductive ring 56 to both signal lines 54 52, one of which (signal line 54) being horizontal while the other is vertical in the display panel 112. It is to be understood that the signal line with the switch may be the horizontal signal line 54 or the vertical signal line 52 as shown. In some embodiments, the far end of the signal line 52 coupled to the switch 60 terminates without any other connection, allowing it to float when switch 60 is off. It should be understood that the location of the single node 50, the switch 60, and the origin of the switch control line 70 may independently be anywhere along either side of the display panel 112 or above the display panel 112 or below it as shown.

Figure 9:
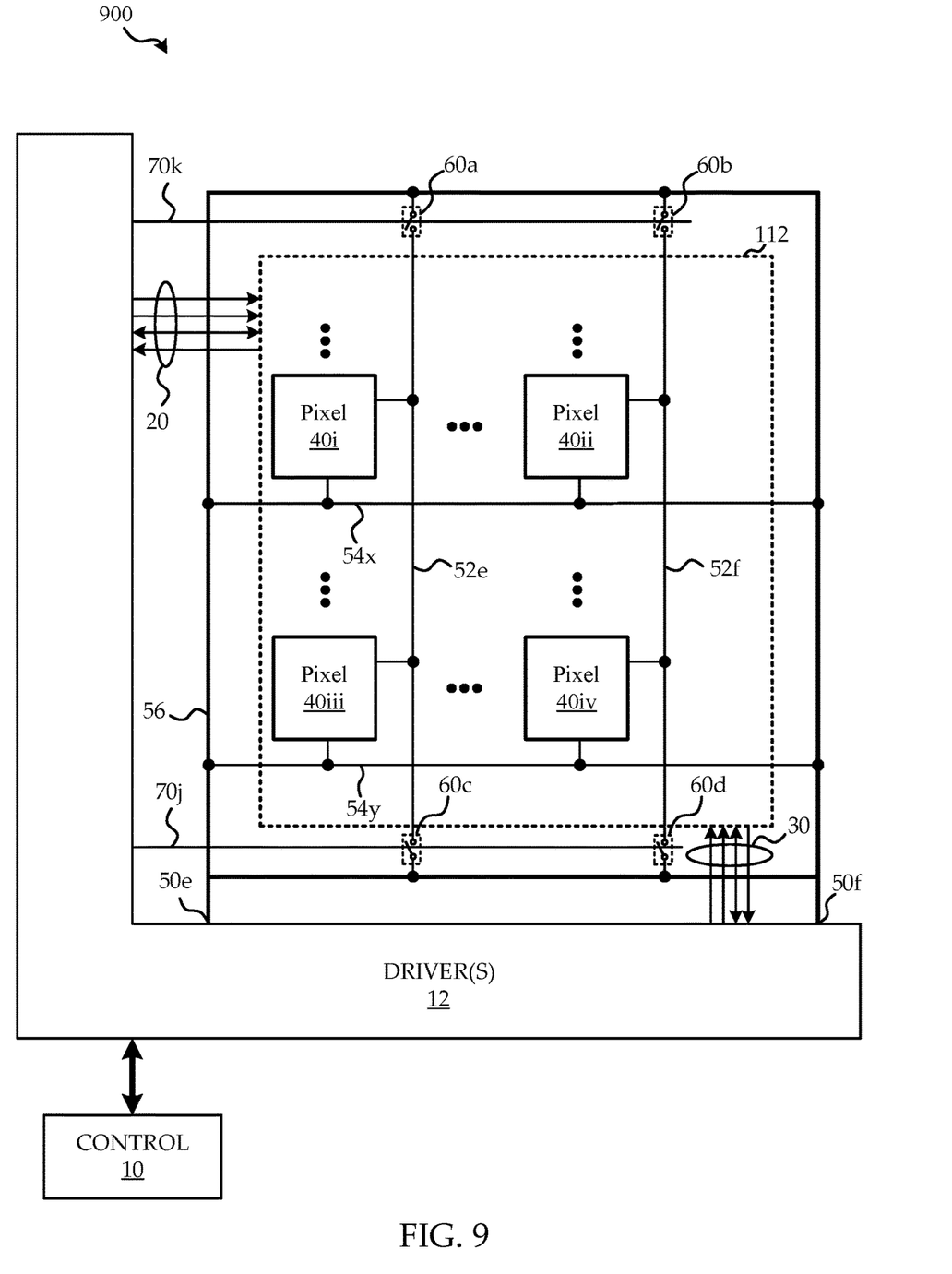
FIG. 9 is a schematic block diagram of a display system in accordance with an example embodiment utilizing horizontal and vertical signal lines common to a plurality of pixels in columns and rows, a conductive ring, and pairs of switches.

Referring now to FIG. 9, an exemplary display system 900 having an exemplary driver-pixel connection according to another embodiment is described. The display system 900 is structured and functions similar to that of FIG. 1 except FIG. 9 explicitly illustrates rows and columns of pixels with one signal line 52e situated beside the pixels 40i, 40iii in one column and another signal line 52f situated beside the pixels 40ii, 40iv in another column. Further signal lines 54x 54y are situated below respectively the pixels 40i 40ii in one row and the pixels 40iii 40iv in another row. In the display system 900 the pixels 40i, 40ii, 40iii, 40iv and any number of other pixels in the same columns are each connected by one node to a vertical signal line 52e 52f and any number of other pixels in the same rows are each connected by a second node to the horizontal signal line 54x 54y. FIG. 9 explicitly illustrates the single node 50 (optionally coupled to the one or more drivers 12 at more than one location 50e 50f) is coupled via a ring 56 to all signal lines 52e 52f 54x 54y at both ends of each signal line 52e 52f 54x 54y. The display system 900 also includes two switches 60a 60c 60b 60d per vertical signal line 52e 52f, controlled by two horizontal switch control lines 70k 70j. It is to be understood that the signal lines with the switches may be the horizontal signal lines 54x 54y and the switch control lines 70j 70k may be vertical. In this embodiment, when both switches 60a 60c 60b 60d of each vertical signal line 52e 52f are off, each vertical signal line 52e 52f is completely disconnected from the pixels 40i, 40ii, 40iii, 40iv, allowing each vertical signal line 52e 52f to float. It should be understood that the locations 50e 50f of the connection of the single node 50 to the one or more drivers 12, the switches 60a 60b 60c 60d, and origin of the control signal lines 70k 70j may independently be anywhere along either side of the display panel 112 or above the display panel 112.

Referring now to FIG. 10 a portion 1000 of display system of FIG. 2 utilizing a pixel circuit of FIG. 3 in an implementation of the example embodiment of FIG. 9, during a measurement of OLED or pixel current is described. The OLED current or pixel current is measured in order to extract parameters of the pixel which may be used for compensation as stated above. The method foregoes the need for a separate monitor line to read the pixel current and OLED current in each pixel. The elimination of an additional monitoring line in the array-based semiconductor, reduces the circuit complexity and allows more space for the pixel circuit layout. FIG. 10 shows a display panel 1000 including a pixel array 202, a VDD ring 132 and switches 150 and 152. The pixel array 112 includes a plurality of pixels 400 arranged in "n" rows and "m" columns. The illustration of the pixel array in FIG. 10 shows only four pixel circuits 400. As illustrated in FIG. 10, during current measurement the current 1204 goes through the data line $V_{DATA}[j]$ 130j to the pixel, for example, in the top-left. The transistors T1, T2, T3 and T5 are on but transistors T4, T6 and T7 are off. The current $I_1$ 204 flows through the transistor T1, T3, T5 and the OLED D1. This current is measured by a Readout Circuit (ROC) 110 as shown in FIG. 12. The supply line VDD2 136 in each pixel is connected directly to the VDD ring 132 but the supply line VDD1 134 in each pixel is connected to the VDD ring 132 through switches 150 and 152. When the switch control signal EN_VDD 118 is set to zero, for example during emission, EN_VDD=0 and the VDD1 node 134 is connected to the VDD ring 132. In order to measure the OLED or pixel current 1204 of, for example, the top-left pixel, the EN_VDD 118 is set to VDD, i.e. EN_VDD=VDD. All VDD1 nodes 134 are disconnected from the VDD ring 132. A constant voltage $V_{DATA}[j]$ is applied between the data line 130j and the VSS terminal 206. To measure the OLED current, the drive transistor T1 is biased to operate in their triode region to behave like a switch. When measuring drive transistor T1 current, T1 may be operated with a number of gate source voltages to determine its parameters. When the current $I_1$ 204 is allowed to flow through T1, T3, T5 and the OLED D1, the other TFT transistors T4, T6 and T7 are off, however transistor T2 is still on in this condition but it does not sink any current. T2 is connected to the VDD1 node 134 but since the node VDD1 134 is disconnected from VDD ring 132 through switches 150j and 152j, the resulting current measured by the ROC 110 is restricted to current passing through the OLED D1 and the drive transistor T1. The measured current value is then used to determine if the OLED or pixel circuit is operating at prescribed levels. When measuring the OLED current, a deviation between the measurement and reference value will be automatically corrected by adjusting the OLED current sufficiently so as to compensate for the deviation during normal operation of the display. A similar measurement may be made of the pixel current, i.e. the current of the drive transistor T1, so that parameters are extracted for compensating the operation of the drive transistor T1.

Figure 11:
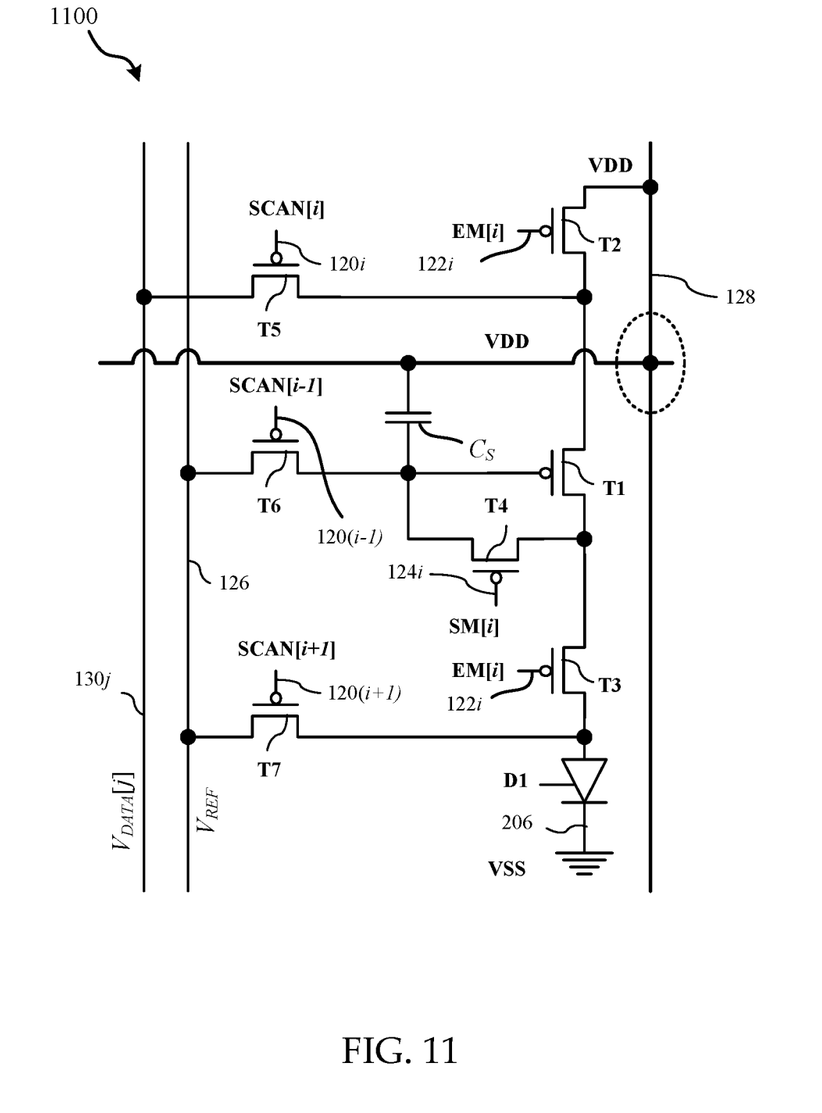
FIG. 11 is a schematic circuit diagram of an example pixel circuit design, to which design modifications may be made to arrive at the pixel circuit of FIG. 3, which is implemented in the example embodiments of FIG. 10 and FIG. 12.

Referring now to FIG. 11, a design of a pixel circuit 1100 which may be varied to obtain the pixel circuit of FIG. 3 is briefly discussed. The pixel circuit 1100 of FIG. 11 is substantially the same as the pixel circuit 300 of FIG. 3, except for that both vertical and horizontal VDD lines of pixel circuit 1100 are coupled in a grid 128 having connections inside each pixel circuit (indicated by the dotted ellipse). Instead of two VDD nodes shown in FIG. 3, the design of the pixel circuit 1100 has only one VDD node. After programming the pixel circuit 1100 the VDD node connected to the capacitor $C_s$ does not sink any current from VDD line. It should be noted here that sometimes in display panels, the VDD supply routing is distributed in a grid pattern to minimize the voltage drop due to line loses across the array. A modification to the VDD grid pattern of the pixel of FIG. 11 is used to facilitate the current measurement illustrated in FIG. 10. The modification to the VDD grid pattern involves the elimination of the connection point at each intercept of the VDD 128 horizontal and vertical conductors as shown in FIG. 11, resulting in a disconnected grid pattern. The design of the VDD 128 in FIG. 11 is therefore separated into two nodes, VDD1 134 and VDD2 136 to form the design in FIG. 3. The supply line VDD2 136 is always connected to VDD ring 132 but the supply line VDD1 134 is disconnected from VDD ring 132 during OLED and pixel current measurement.

Referring now to FIG. 12 the ROC 110 as shown in FIG. 2 includes an integrator 510, an analog to digital converter (ADC) 501, and one switch 507 coupling the ROC 110 to the data line 130j at the integrator 510. The integrator 510 includes a reset switch 508 and an integrating capacitor $C_I$ in parallel and connected between a first input 506 and an output of the integrator 510 and a bias voltage $V_B$ coupled to a second input 505 of the integrator 510. During measurement, the switch 507 is closed and the integrator 510 integrates the current ($I_1$ 204) going to the pixel 400 and converts it to a corresponding voltage 503. The output voltage 503 of the integrator is applied to the ADC 501 and this voltage is converted to 10 to 16 bit digital code 502 by the ADC 501.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of an invention as defined in the appended claims.

What is claimed is:

1. A display system comprising:
   a plurality of pixels arranged in rows and columns;
   at least one driver for driving the plurality of pixels;
   a controller coupled to the at least one driver for controlling the at least one driver's driving of the plurality of pixels;
   a first signal line coupling a first node of a first pixel of the plurality of pixels to a node of the at least one driver; and
   a second signal line coupling a second node of the first pixel to the node of the at least one driver via a controllable switch coupled along the second signal line and located outside of the plurality of pixels, the controllable switch for coupling the second signal line to the node of the at least one driver and for decoupling the second signal line from the node of the at least one driver,
   wherein the controller is adapted to control the controllable switch to turn on and connect the second node of the first pixel to the supply voltage during an emission cycle, and wherein the controller is adapted to control the controllable switch to turn off and disconnect the second node of the first pixel from the supply voltage during a measurement cycle.

2. The display system of claim 1, wherein the node of the at least one driver comprises a supply voltage output of the at least one driver for providing a supply voltage to the first pixel.

3. The display system of claim 2, wherein one of the first signal line and the second signal line comprises a row signal line extending along a row direction from the controllable switch toward the first pixel, and the other of the first signal line and the second signal line comprises a column signal line extending along a column direction from the node of the at least one driver toward the first pixel.

4. The display system of claim 3, wherein the node of the at least one driver comprises an unbroken conductive ring surrounding the plurality of pixels, wherein the first signal line is coupled to the unbroken conductive ring, and wherein the second signal line is coupled to the unbroken conductive ring via the controllable switch.

5. The display system of claim 4, wherein the first signal line and the second signal line extend adjacent to and beyond the first pixel, wherein each of the first signal line and the second signal line are coupled to multiple pixels of the plurality of pixels.

6. The display system of claim 5, wherein the second node is coupleable to the first pixel at a location along a conductive path between a light-emitting device of the first pixel and a signal line used for measuring the first pixel during said measurement cycle.

7. The display system of claim 6, wherein the first signal line spans the unbroken conductive ring and the second signal line is coupled at one end to the controllable switch and coupled at an opposite end to a second controllable switch coupled to the unbroken conductive ring.

8. The display system of claim 7, wherein the signal line comprises a data line coupled to the first pixel.

9. The display system of claim 8, wherein the first signal line is one of a first plurality of signal lines spanning the unbroken conductive ring in a first direction and the second signal line is one of a second plurality of signal lines spanning the unbroken conductive ring in a second direction, the first plurality of signal lines, the second plurality of signal lines, and the unbroken conductive ring forming a disconnected grid structure.

10. The display system of claim 9, further comprising a readout circuit for, during said measurement cycle, reading a voltage or current from the first pixel over said data line coupled to the first pixel, and wherein said first node is located in the first pixel other than along said conductive path.

11. The display system of claim 1, wherein one of the first signal line and the second signal line comprises a row signal line extending along a row direction from the controllable switch toward the first pixel, and the other of the first signal line and the second signal line comprises a column signal line extending along a column direction from the node of the at least one driver toward the first pixel.

12. The display system of claim 1, wherein the node of the at least one driver comprises an unbroken conductive ring surrounding the plurality of pixels, wherein the first signal line is coupled to the unbroken conductive ring, and wherein the second signal line is coupled to the unbroken conductive ring via the controllable switch.

13. The display system of claim 12, wherein the first signal line spans the unbroken conductive ring and the second signal line is coupled at one end to the controllable switch and coupled at an opposite end to a second controllable switch coupled to the unbroken conductive ring.

14. The display system of claim 1, wherein the second signal line extends adjacent to and beyond the first pixel, wherein the second signal line is coupled to multiple pixels of the plurality of pixels, and wherein an end of the second signal line opposite from the controllable switch is uncoupled.

15. The display system of claim 1, wherein the second node is coupleable to the first pixel at a location along a conductive path between a light-emitting device of the first pixel and a signal line used for measuring the first pixel during said measurement cycle.

16. The display system of claim 15, wherein the signal line comprises a data line coupled to the first pixel.

17. A display system comprising:
   a plurality of pixels arranged in rows and columns;
   at least one driver for driving the plurality of pixels;
   a controller coupled to the at least one driver for controlling the at least one driver's driving of the plurality of pixels;
   a first signal line coupling a first node of a first pixel of the plurality of pixels to a node of the at least one driver;
   a second signal line coupling a second node of the first pixel to the node of the at least one driver via a controllable switch coupled along the second signal line and located outside of the plurality of pixels, the controllable switch for coupling the second signal line to the node of the at least one driver and for decoupling the second signal line from the node of the at least one driver; and
   a readout circuit for reading a voltage or current from the first pixel over a data line coupled to the first pixel,
   wherein the node of the at least one driver comprises a supply voltage output of the at least one driver for providing a supply voltage to the first pixel, wherein one of the first signal line and the second signal line comprises a row signal line, and the other of the first signal line and the second signal line comprises a column signal line, wherein the node of the at least one driver comprises a conductive ring surrounding the plurality of pixels, wherein the first signal line is coupled to the conductive ring, and wherein the second signal line is coupled to the conductive ring via the controllable switch, wherein the first signal line and the second signal line extend adjacent to and beyond the first pixel, wherein each of the first signal line and the second signal line are coupled to multiple pixels of the plurality of pixels, wherein the plurality of pixels comprise OLED pixels, wherein the first signal line spans the conductive ring and the second signal line is coupled at one end to the controllable switch and coupled at an opposite end to a second controllable switch coupled to the conductive ring, wherein the controller is adapted to control the at least one driver to send switch control signals over at least one switch control line coupled to the controllable switch and the second controllable switch, wherein the first signal line is one of a first plurality of signal lines spanning the conductive ring in a first direction and the second signal line is one of a second plurality of signal lines spanning the conductive ring in a second direction, the first plurality of signal lines, the second plurality of signal lines, and the conductive ring forming a disconnected grid structure, and wherein the controller is adapted to control the controllable switch and the second controllable switch to turn on and connect the second node of the first pixel to the supply voltage during an emission cycle, and wherein the controller is adapted to control the controllable switch and the second controllable switch to turn off and disconnect the second node of the first pixel from the supply voltage while reading a voltage or current from the first pixel over the data line.

* * * * *

UNITED STATES PATENT AND TRADEMARK OFFICE
CERTIFICATE OF CORRECTION

PATENT NO. : 10,943,540 B2
APPLICATION NO. : 16/381577
DATED : March 9, 2021
INVENTOR(S) : Qing Jiang et al.

Page 1 of 1

It is certified that error appears in the above-identified patent and that said Letters Patent is hereby corrected as shown below:

In the Claims

Claim 3, Column 11, Line 38:
Please amend "The display system of claim 2, wherein..."
To read:
-- The display system of claim 1, wherein... --

Claim 4, Column 11, Line 45:
Please amend "The display system of claim 3, wherein..."
To read:
-- The display system of claim 1, wherein... --

Signed and Sealed this
Twenty-second Day of October, 2024

Katherine Kelly Vidal
*Director of the United States Patent and Trademark Office*